United States Patent
Teodorescu et al.

(10) Patent No.: US 8,067,932 B2
(45) Date of Patent: Nov. 29, 2011

(54) ADVANCED REAL-TIME GRID MONITORING SYSTEM AND METHOD

(75) Inventors: Remus Teodorescu, Aalborg (DK); Pedro Rodriguez, Terrasa (ES)

(73) Assignee: Gamesa Innovation & Technology, S.L., Sarriguren (Navarra) (ES)

(*) Notice: Subject to any disclaimer, the term of this patent is extended or adjusted under 35 U.S.C. 154(b) by 443 days.

(21) Appl. No.: 12/513,531

(22) PCT Filed: Nov. 6, 2007

(86) PCT No.: PCT/DK2007/000483
§ 371 (c)(1),
(2), (4) Date: May 5, 2009

(87) PCT Pub. No.: WO2008/055499
PCT Pub. Date: May 15, 2008

(65) Prior Publication Data
US 2010/0213925 A1 Aug. 26, 2010

(30) Foreign Application Priority Data
Nov. 6, 2006 (DK) .................. 2006 01442

(51) Int. Cl.
*G01R 19/25* (2006.01)
(52) U.S. Cl. .............. 324/76.78; 324/107; 324/108; 327/231; 327/237; 327/239; 327/254; 327/255; 363/40
(58) Field of Classification Search ............... 324/76.78
See application file for complete search history.

(56) References Cited

U.S. PATENT DOCUMENTS

| | | | | |
|---|---|---|---|---|
| 3,641,447 A | * | 2/1972 | Gaines et al. ................... | 327/7 |
| 3,757,214 A | * | 9/1973 | Kaufman ................... | 324/76.78 |
| 4,071,821 A | * | 1/1978 | Harthill et al. ............ | 324/76.77 |
| 4,888,701 A | * | 12/1989 | Wakasugi et al. .............. | 702/65 |

(Continued)

OTHER PUBLICATIONS

Rodriguez, P., et al. "New Positive-sequence Voltage Detector for Grid Synchronization of Power Converters under Faulty Grid Conditions." *Power Electronics Specialists Conference* (2006) 37$^{th}$ IEEE Jeju, Korea pp. 1-7.

(Continued)

*Primary Examiner* — Timothy J Dole
*Assistant Examiner* — Benjamin M Baldridge
(74) *Attorney, Agent, or Firm* — Ladas & Parry LLP

(57) ABSTRACT

This invention deals with an advanced Real-time Grid Monitoring System (RTGMS) suitable for both single-phase and three-phase electric power systems. This invention provides an essential signal processing block to be used as a part of complex systems either focused on supervising and diagnosing power systems or devoted to control power processors interacting with the grid. This invention is based on a new algorithm very suitable for real-time characterization of the grid variables under distorted and unbalanced grid conditions. The main characteristic of this invention is the usage of a frequency-locked loop, based on detecting the grid frequency, for synchronizing to the grid variables. It results in a very robust system response in relation to existing technique based on the phase-angle detection since grid frequency is much more stable variable than the grid voltage/current phase-angle, mainly during grid faults. Moreover, the algorithm supporting this invention is very efficient and can be implemented in regular industrial microprocessors. These features make the RTGMS object of this invention ideal to be applied in the control of distributed generation systems (DGS), flexible AC transmission systems (FACTS), power quality conditioners (PQC) and uninterruptible power supplies (UPS). In all these systems, the fast and precise real time detection of the voltage and/or current sequence components under grid fault conditions is a crucial matter.

7 Claims, 8 Drawing Sheets

U.S. PATENT DOCUMENTS

| | | | | |
|---|---|---|---|---|
| 5,001,419 | A * | 3/1991 | Miller | 324/76.78 |
| 6,909,270 | B2 * | 6/2005 | Uchino | 324/76.52 |
| 6,977,827 | B2 * | 12/2005 | Gritter | 363/40 |
| 2003/0030426 | A1 * | 2/2003 | Pickerd | 324/76.58 |
| 2005/0187752 | A1 * | 8/2005 | Colby et al. | 703/19 |
| 2007/0005194 | A1 * | 1/2007 | Chang et al. | 700/292 |
| 2007/0189045 | A1 * | 8/2007 | Gritter | 363/40 |

OTHER PUBLICATIONS

Timbus, A. V., et al. "Grid monitoring for distributed power generation systems to comply with grid codes." *2006 IEEE International Symposium on Industrial Electronics 9-13* Montreal, Quebec, Canada pp. 1608-1612.

Cataliotti, A., et al. "A new Phase Locked Loop Strategy for Power Quality Instruments Synchronisation." *Instrumentation and Measurement Technology Conference* (2005) *IMTC 2005 Proceedings of the IEEE Ottawa, Canada* vol. 2, pp. 941-946.

Rodriguez, P., et al. "Advanced Grid Synchronization System for Power Converters under Unbalanced and Distorted Operating Conditions." *IECON 2006 $32^{nd}$ Annual Conference on IEEE Industrial Electronics* (2006) pp. 5173-5178.

Krieger, A. W., et al. "Frequency Locked Phase Estimation." *Electrical and Computer Engineering CCECE 2007, Canadian Conference on IEEE, PI* (2007) pp. 566-570.

\* cited by examiner

ADVANCED REAL-TIME GRID MONITORING SYSTEM AND METHOD

FIELD OF THE INVENTION

The present invention relates to real-time grid variables monitoring, voltage and current, in electrical power systems for single-phase and three-phase networks.

Monitoring and characterization of grid voltage and current parameters is a vital task in most of the electrical equipments related to power systems. This invention is dealing with an advanced Real-time Grid Monitoring System (RTGMS) using a new algorithm suitable for either single-phase or multi-phase networks preferable three-phase networks. The RTGMS object of this patent can be used as an essential part of complex systems either focused on supervising and diagnosing power systems or devoted to control power processors interacting with the grid. This invention is based on a new algorithm very suitable for real-time characterization of the grid variables under distorted and unbalanced grid conditions. Effectiveness of this new monitoring algorithm is justified by its high stability, fast response and low computational cost. The RTGMS exhibits excellent performances in terms of robustness, precision and speed in the detection of the positive- and negative-sequence components of the grid voltage in three-phase systems, which makes it very suitable for instantaneous synchronization to the voltage sequence components during grid faults. This last feature makes the proposed RTGMS ideal to be applied in the control of distributed generation systems (DGS), flexible AC transmission systems (FACTS), power quality conditioners (PQC) and uninterruptible power supplies (UPS). In all these systems, real-time detection of the voltage and/or current sequence components is a crucial matter, for example to implement current and voltage conditioning functionality, to accomplish the fault ride-through requirements stated in the international grid codes, and to detect instantaneous voltage and frequency changes in anti-islanding protection systems.

BACKGROUND OF THE INVENTION

Information provided by a grid monitoring system is generally used to supervise the grid operating conditions, diagnose grid faults characteristics, synchronize power converters to the grid, calculate power flows, translate state variables of complex systems into synchronous reference frames, and calculate current and voltage references of power converters operating under generic grid conditions.

Regardless of the technique used in the monitoring system, amplitude, frequency and phase of the monitored variables must be obtained in a fast and accurate manner. Additionally, when the monitoring system is applied to a multi-phase networks preferable three phase grid, sequence components should be rapidly and precisely detected as well, even if the utility voltage is distorted and unbalanced. It is worth to remark that a real-time monitoring system should be based on a simple algorithm, with a low computational burden, which can be computed in each sampling period.

Grid monitoring can be performed by assuming a constant and well know value for the utility frequency. This approach makes calculations simple but gives rise to detection errors when frequency differs from its rated value. It is a common incident in micro-grid and weak grids, with widespread usage of distributed generators, working under faulty conditions. The most extended technique used for achieving a frequency-insensitive grid monitoring is using a Phase-Locked Loop (PLL). Regarding three-phase systems, considered as the most general case of grid monitoring, the following real-time monitoring systems based on the usage of some kind of PLL has been reported in the literature:

Monitors based on the Synchronous Reference Frame (SRF-PLL) [1] are broadly used in measurement and control systems. However, as reported in the literature [2], the SRF-PLL gives rise to unacceptably deficient results in presence of the voltage imbalance.

Monitors based on the Decoupled Double Synchronous Reference Frame (DSRF-PLL) [3] are able to estimate the positive- and negative-sequence components at fundamental frequency under unbalanced grid conditions. However the DSRF-PLL should be implemented in a high performance digital signal processor because of its notable computational cost. This constraint complicates its application in the detection of multiple harmonic components.

Monitors based on the single-phase Enhanced Phase-Locked Loop (EPLL) [4] achieve the isolation of the positive- and negative-sequence components by means of the usage of frequency adaptive single-phase notch filters [5] and the instantaneous symmetrical components method on the a-b-c reference frame [6]. The EPLL-based GMS could be applied under unbalanced grid conditions, however its response is slow and its computational burden is so high since four singe-phase EPLLs are necessary to implement a three-phase application. Moreover, its single-phase origin makes the GMS sensible to the effects of zero-sequence components in the grid voltage.

Monitors based on the Dual Second Order Generalized Integrator (DSOGI-PLL) [7] are also able to estimate the positive- and negative-sequence components under unbalanced grid conditions and its computational cost is smaller than earlier approaches.

All the previously presented grid monitoring techniques come from the evolution of the conventional single-phase PLL technique and different approaches have applied in order to make them robust enough for detecting sequence components in three-phase systems under generic unbalanced and distorted grid conditions. Consequently, all of these techniques have a common characteristic, namely, the monitoring algorithm is based on the detection of the phase-angle of the variable to be screened.

WO 02/091578 concerns a new structure for phase-locked loop (PLL) system. As with conventional PLLs, this invention consists of phase detection, loop filter and voltage-controlled oscillator units. An alternative phase detection structure, inspired by concepts from adaptive filtering and dynamical systems theory, is presented which substantially enhances the performance of the loop in terms of stability and dynamic performance. Presented phase detection scheme obviates the need for sophisticated loop filters, so much so that a first order filter suffices for most applications. In addition to the normal function of a PLL, the present system directly generates estimates of the amplitude, phase and frequency of the input signal. This feature extends the range of applications of the system beyond well-known applications of PLL in various disciplines of electrical.

US 2005/0231871 concerns a Three-phase Power Signal Processor (TPSP) is disclosed for general three-phase power system applications. The TPSP is developed based on the concepts from adaptive filter and dynamical systems theories. The structure of the TPSP is unified as it provides a multiplicity of the signals and pieces of information without the need to change, modify, or enhance the structure or to impose excessive computational time or resource requirements. The presented TPSP receives a set of three-phase measured signals, which can be voltage, current, magnetic flux, etc, and provides (1) the instantaneous and steady-state symmetrical components, (2) the fundamental components, (3) the peak values (magnitudes) of the symmetrical components, (4) the frequency and its rate of change, (5) the synchronization signal(s) and zero-crossing instants, (6) the phase-angles of the symmetrical components, and (7) the disturbance signatures. Two or more TPSP units, when properly augmented, further provide (8) the individual harmonic components, (9) the inter-harmonics, (10) the instantaneous real and reactive current components, (11) the total harmonic distortion, dc-offset, and power factor. The TPSP can serve as the building block for various signal processing requirements encountered in the context of power system applications including power systems control, protection, monitoring, and power quality.

OBJECT OF THE INVENTION

The object of the present invention is to achieve a new, more efficient and robust monitoring system which is based on the detection of the grid frequency.

DESCRIPTION OF THE INVENTION

The PLL-based monitoring systems have been conventionally used as an essential block in the control of complex grid connected systems. However, they can cause control and detection errors under generic grid conditions. As an example, modern grid code requirements for the connection of wind turbines (WT) to the grid have demonstrated how limited conventional monitoring and synchronization systems can become for implementing control systems allowing fault ride-through capability in WT.

In relation to precedent systems, this invention presents an advanced real-time grid monitoring system with two main specific characteristics:

The monitoring system object of this invention is based on the detection of the grid frequency by using a Frequency-Locked Loop (FLL). This makes the presented RTGMS much more robust than its predecessors based on the phase-angle detection using a PLL since grid frequency is more stable variable than the grid voltage phase-angle, mainly during grid faults.

The algorithm supporting the monitoring system object of this invention can be implemented in regular industrial microprocessors since it is computationally simpler than other algorithms in existing PLL approaches. In this invention no phase-angles are used and consequently no trigonometric functions are necessary in the implementation.

SUMMARY OF THE INVENTION

FIG. 1 shows the block diagram of the advanced real-time monitoring system object of this invention when it is applied to a single-phase system. In this case it is constituted by two fundamental building blocks:

The quadrature signal generator (QSG), {1} in FIG. 1.
The frequency-locked loop (FLL), {2} in FIG. 1.

The QSG is a functional block in charge of generating a pair of orthogonal signal, v' and qv', synchronized to the input signal v. In the QSG, signal v' will be in phase with v, and qv' will be 90 degrees leaded or lagged in relation to v, depending on the technique used in the QSG. Different QSG have been reported in the literature. The simplest QSG techniques, e.g. the use of a transport delay buffer or an all-pass first-order filters, are not frequency adaptive and do not block harmonics. More sophisticated techniques, e.g. the application of the inverse Park transformation or the Hilbert transformer [8], can be used in single-phase systems but entail a high computational burden. Studies conducted in this invention have demonstrated that a QSG based on the usage of a Second Order Generalized Integrator (SOGI) offers excellent results in terms of harmonics rejection, simplicity, speed and accurately, giving rise to a lower computational load than other existing techniques. The SOGI-based QSG can be understood as a particular implementation of a band-pass filter and it is not frequency adaptive itself. Therefore the motoring system in this invention uses an additional frequency loop to keep the QSG tuned with the input signal.

As previously mentioned, conventional grid monitoring systems are habitually based on the usage of a PLL. It means that the synchronization system estimates the phase-angle of the either phase voltage (single-phase) or voltage vector (three-phase). However, the phase-angle is a very unstable variable under grid fault conditions. Moreover, trigonometric functions are always necessary to deal with the phase angle which increases the computational load of the monitoring algorithm and makes system analysis complex. In this invention, the grid frequency is the key variable of the monitoring system (FLL). It gives rises to a very robust monitoring algorithm since grid frequency is a much more stable than the grid phase even in faulty grids. There are not precedents in the literature reporting the use of a FLL for grid monitoring purposes.

The main parameters of the supervised signal can be calculated using the monitoring system of FIG. 1 as follow:

$$\hat{v}' = \sqrt{(v')^2 + (qv')^2} \; ; \cos\theta' = \frac{v'}{\hat{v}'}; \sin\theta = \frac{qv'}{\hat{v}'}; \omega', \quad (1)$$

where $\hat{v}'$ is the estimated peak value of the input signal v. Moreover, $\cos\theta'$ and $\sin\theta'$, with $\theta'$ the estimated phase-angle of the input signal, are calculate easily from the output variables. In (1), $\omega'$ is the estimated value for the grid frequency.

Three independent single-phase systems like that shown in FIG. 1 could be used to monitoring a three phase system. However, in such case it is much more efficient to consider the three-phase system as a whole to obtain its characteristic parameters. FIG. 2 shows the block diagram of the grid monitoring system object of this invention when it is applied to three-phase systems. In this case, the three-phase variables are translated from the abc to the αβ reference frame by using the Clarke transformation; marked as {3} in FIG. 2. Two QSG are used to obtain the in-quadrature version of the αβ signals and this block is called the Dual QSG (DQSG); marked as {4} in FIG. 2. Since both QSG work at the same frequency, only on FLL is necessary for the effective tuning of the DQSG. Once the set if in-quadrature signal on the αβ reference frame are available, the sequence components are calculated by of the positive/negative sequence calculator (PNSC). The PNSC works in real time, which makes necessary the usage of the Instantaneous Symmetrical Components (ISC) calculation method [9]. In this invention however, instead to use the calculation on natural reference frame originally proposed by Lyon, the Clarke transformation is applied to formulate this calculation on the αβ reference frame (stationary and orthogonal) [10]. Positive and negative components at fundamental frequency of the monitored variable are available at the output of the PNSC and characteristics parameters can be calculated as follow:

$$|v^{+'}| = \sqrt{(v_\alpha^{+'})^2 + (v_\beta^{+'})^2} \; ; \; \cos\theta^{+'} = \frac{v_\alpha^{+'}}{|v^{+'}|} \; ; \; \sin\theta^{+'} = \frac{v_\beta^{+'}}{|v^{+'}|} \; ; \; \omega', \tag{2a}$$

$$|v^{-'}| = \sqrt{(v_\alpha^{-'})^2 + (v_\beta^{-'})^2} \; ; \; \cos\theta^{-'} = \frac{v_\alpha^{-'}}{|v^{-'}|} \; ; \; \sin\theta^{-'} = \frac{v_\beta^{-'}}{|v^{-'}|}, \tag{2b}$$

where $|v^{+'}|$ and $|v^{-'}|$ are the voltage amplitudes and $\theta^{+'}$ and $\theta^{-'}$ are the phase angles of the positive and negative sequence voltage components, respectively. $\omega'$ is the estimated grid frequency.

DETAILED DESCRIPTION OF THE INVENTION

A more detailed description of the building blocks constituting a preferred embodiment of the RTGMS object of this invention will be given in the following. Even though this invention can be used for monitoring either current or voltage, only grid voltage will be considered in the following for the sake of simplifying.

SOGI-Based Quadrature Signal Generator (SOGI-QSG).

Figure 3:
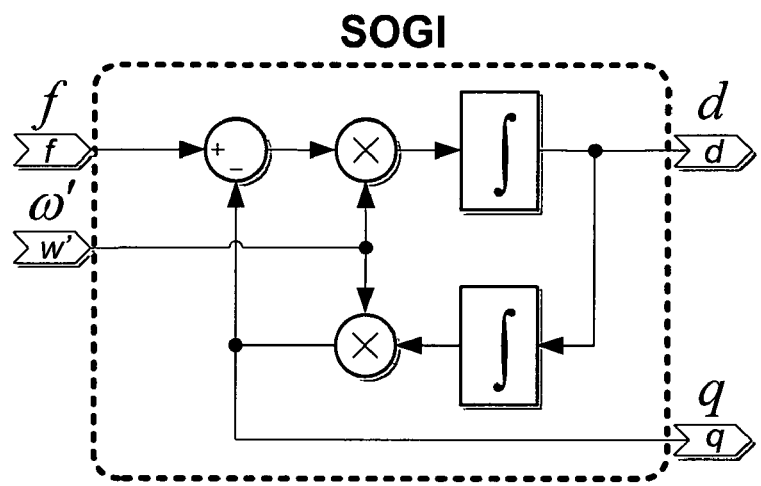
FIG. 3 shows the specific implementation of the second-order generalized integrator (SOGI) developed in the research conducted in this invention. In relation to other conventional SOGI implementations, this implementation presents a particular distribution of integrators and multipliers, which gives rise to a more stable response in presence of transients in the input variables.

The block diagram shown in FIG. 3 depicts the specific SOGI implementation performed in this invention. This particular layout of multipliers and integrators offers a more stable response in front of sudden variations of the input signals. Transfer function if the SOGI depicted in FIG. 3 is:

$$S(s) = \frac{d}{f}(s) = \frac{s\omega'}{s^2 + \omega'^2} \tag{3}$$

Denominator of transfer function in (3) evidences the resonant characters of the SOGI, giving rise to two complex poles at $\pm j\omega'$. Consequently, the SOGI will act as an ideal infinite-gain integrator when input signal f is sinusoidal signal at $\omega'$ frequency.

Figure 4:
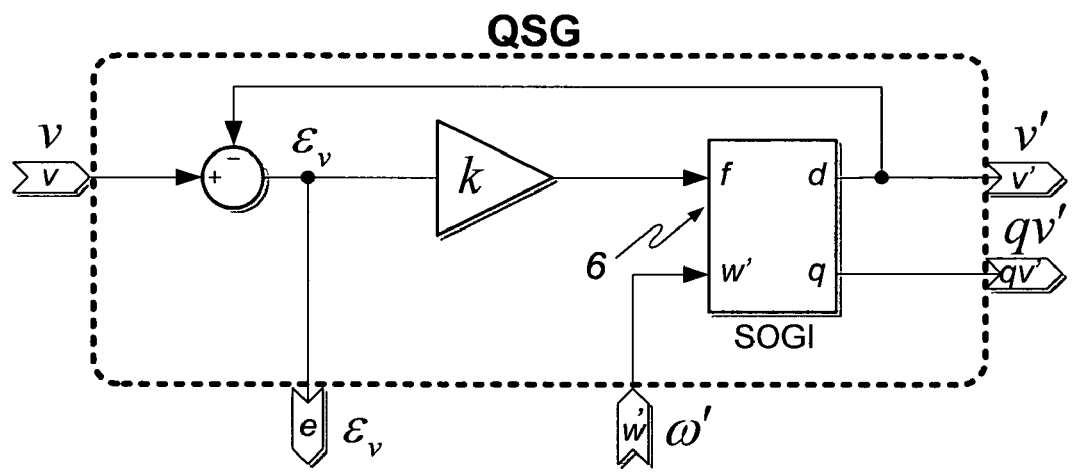
FIG. 4 shows the structure of the SOGI-based QSG used in this invention. The block marked with {6} represents the SOGI. This specific QSG implementation can be understood as a particular implementation of an adaptive band-pass filter, where input $\omega'$ sets the tuning frequency and gain k sets the damping factor of the QSG.

According to the ideal integrator character for $\omega'$ frequency, the system shown in FIG. 4 is used to track the input signal v. Characteristics transfer functions of such system are given by:

$$D(s) = \frac{v'}{v}(s) = \frac{k\omega' s}{s^2 + k\omega' s + \omega'^2} \tag{4a}$$

$$Q(s) = \frac{qv'}{v}(s) = \frac{k\omega'^2}{s^2 + k\omega' s + \omega'^2} \tag{4b}$$

Transfer functions of (4) present three remarkable characteristics:

According transfer functions of (4), output signals of the system shown in FIG. 4, i.e., v' and qv' are in-quadrature signals, with qv' 90°-lagged respect to v'. For this reason, system of FIG. 4 is called as quadrature signals generator (QSG) in this invention. T SOGI-based QSD of FIG. 4 can be understood as a particular implementation of an adaptive filter in which its dynamics is set by the input $\omega'$, setting its tuning frequency, and the gain k, setting its damping factor.

Transfer functions of (4) reveal that the SOGI-based QSG provides band-pass and low-pass filtering characteristic to the direct and in-quadrature outputs respectively, v' and qv', which is interesting to attenuate harmonics and noise from input variable v. System shown in FIG. 4 is frequency adaptive and its synchronization to the grid variables is achieved by adjusting the $\omega'$ parameter. However, qv' will be always 90°-lagging v', independently of both the frequency of v and the values of $\omega'$ and k.

Frequency-Locked Loop (FLL).

Conventional monitoring systems use a Phase Locked-Loop (PLL) for grid synchronization. Conventionally, the input stage of a PLL is a phase-detector (PD) by means of which phase of the input signal is compared with the phased detected by the PLL. Phase-angle is a very unstable variable during grid fault conditions and conventional PLL-based monitoring systems give rise to detection errors under such faulty grid conditions.

Figure 5:
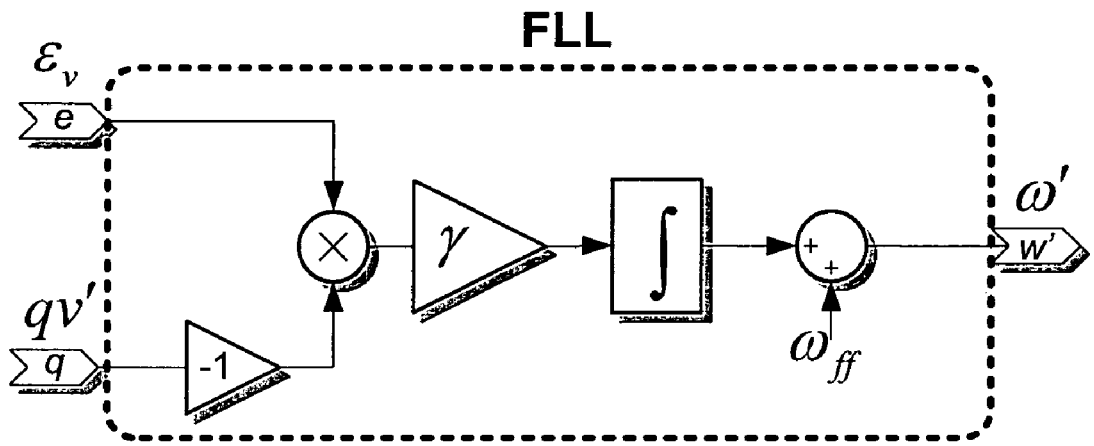
FIG. 5 shows the structure of the frequency controller in FLL. This controller receives the QSG error signal ($\epsilon_v$) and the in-quadrature signal (qv') to perform an inner phase detection which is used as the input of an integral controller with gain γ. The output of this controller is $\omega'$, the tuning frequency of the QSG.

FIG. 5 shows the structure of the controller in the FLL. This controller does not work directly with the input signal v for detecting the phase-angle error in the output of the QSG. Instead of this, this invention uses as an input the error signal of the QSG, $\epsilon_v$. The error signal $\epsilon_v$ is multiplied by the in-quadrature signal, qv', in order to obtain an inner variable phase-detector. The output of this multiplier is applies as an input to an integral controller with gain γ. The output of this integral controller is ω', the tuning frequency of the QSG. The detection system resulting from earlier described arrange is simpler than conventional PLL and neither phase-angle nor trigonometric functions are used for frequency estimation, being possible to talk about a Frequency-Locked Loop (FLL) instead of a PLL.

The most remarkable characteristics of the proposed FLL-based RTGMS are its robustness, simplicity, precision, and effectiveness monitoring signals resulting from grids faults which are used to be characterized by remarkable phase-angle jumps. In conventional PLL-based GMS, the grid voltage phase-angle is the main adaptive variable in the detection algorithm. In the proposed FLL-based RTGMS, the fundamental adaptive variable is not the grid voltage phase-angle but the grid frequency which confers a great stability to the detection system.

Positive- and Negative-Sequence Components Calculation.

In three-phase applications, instantaneous positive- and negative-sequence components, $v_{abc}^+$ and $v_{abc}^-$, of a generic three-phase voltage vector $v_{abc} = [v_a\ v_b\ v_c]^T$ are given by:

$$v_{abc}^+ = [v_a^+\ v_b^+\ v_c^+]^T = [T_+]v_{abc};\ v_{abc}^- = [v_a^-\ v_b^-\ v_c^-]^T = [T_-]v_{abc} \quad (5a)$$

where $[T_+]$ and $[T_-]$ are defined as:

$$[T_+] = \frac{1}{3}\begin{bmatrix} 1 & a & a^2 \\ a^2 & 1 & a \\ a & a^2 & 1 \end{bmatrix}; [T_-] = \frac{1}{3}\begin{bmatrix} 1 & a^2 & a \\ a & 1 & a^2 \\ a^2 & a & 1 \end{bmatrix} \quad (5b)$$

with $a = e^{j\frac{2\pi}{3}} = -1/2 + e^{j\frac{\pi}{2}}\sqrt{3}/2$.

This invention is based on the usage of a QSG generating a set of in-quadrature signals v' and qv', therefore it is of interest in this invention to apply the Clarke transformation to translate the voltage vector from the abc to the αβ reference frames as follow:

$$v_{\alpha\beta} = [v_\alpha\ v_\beta]^T = [T_{\alpha\beta}]v_{abc}; [T_{\alpha\beta}] = \sqrt{\frac{2}{3}}\begin{bmatrix} 1 & -\frac{1}{2} & -\frac{1}{2} \\ 0 & \frac{\sqrt{3}}{2} & -\frac{\sqrt{3}}{2} \end{bmatrix} \quad (6)$$

Figure 6:
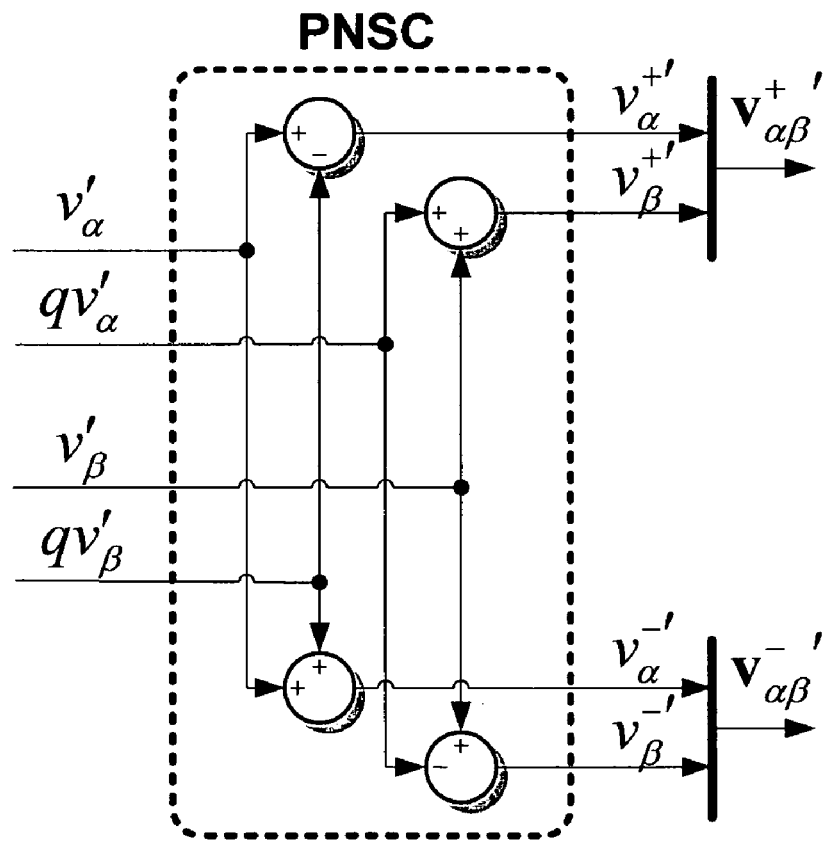
FIG. 6 shows the block diagram of the positive-negative-sequence calculator (PNSC) on the αβ reference frame, having two sets of in-quadrature signals at the input.

So instantaneous positive- and negative-sequence voltage components on the αβ reference frame are calculated as:

$$\begin{aligned} v_{\alpha\beta}^+ &= [T_{\alpha\beta}]v_{abc}^+ \\ &= [T_{\alpha\beta}][T_+]v_{abc} \\ &= [T_{\alpha\beta}][T_+][T_{\alpha\beta}]^T v_{\alpha\beta} \\ &= \frac{1}{2}\begin{bmatrix} 1 & -q \\ q & 1 \end{bmatrix}v_{\alpha\beta}, \end{aligned} \quad (7a)$$

$$\begin{aligned} v_{\alpha\beta}^- &= [T_{\alpha\beta}]v_{abc}^- \\ &= [T_{\alpha\beta}][T_-]v_{abc} \\ &= [T_{\alpha\beta}][T_-][T_{\alpha\beta}]^T v_{\alpha\beta} \\ &= \frac{1}{2}\begin{bmatrix} 1 & q \\ -q & 1 \end{bmatrix}v_{\alpha\beta}, \end{aligned} \quad (7b)$$

where $q = e^{-j\frac{\pi}{2}}$ is a phase-shift time-domain operator to obtain in-quadrature version (90°-lagging) of an original waveform. The block diagram of the positive/negative sequence calculator (PVSC) is shown in FIG. 6.

Figure 1:
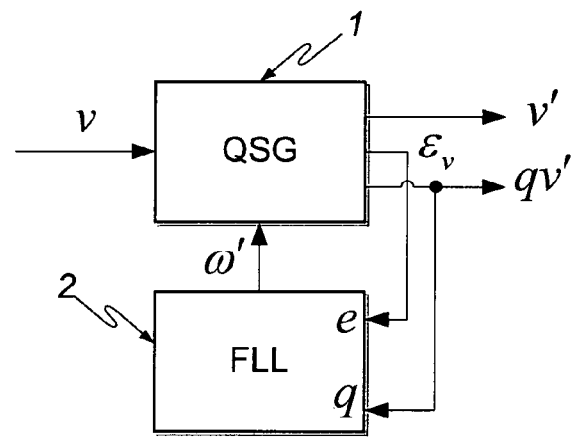
FIG. 1 shows a general block diagram of the single-phase implementation of the RTGMS object of this invention. In this figure, the block marked with {1} is the quadrature signal generator (QSG) and with {2} is the frequency-locked loop (FLL).
Figure 2:
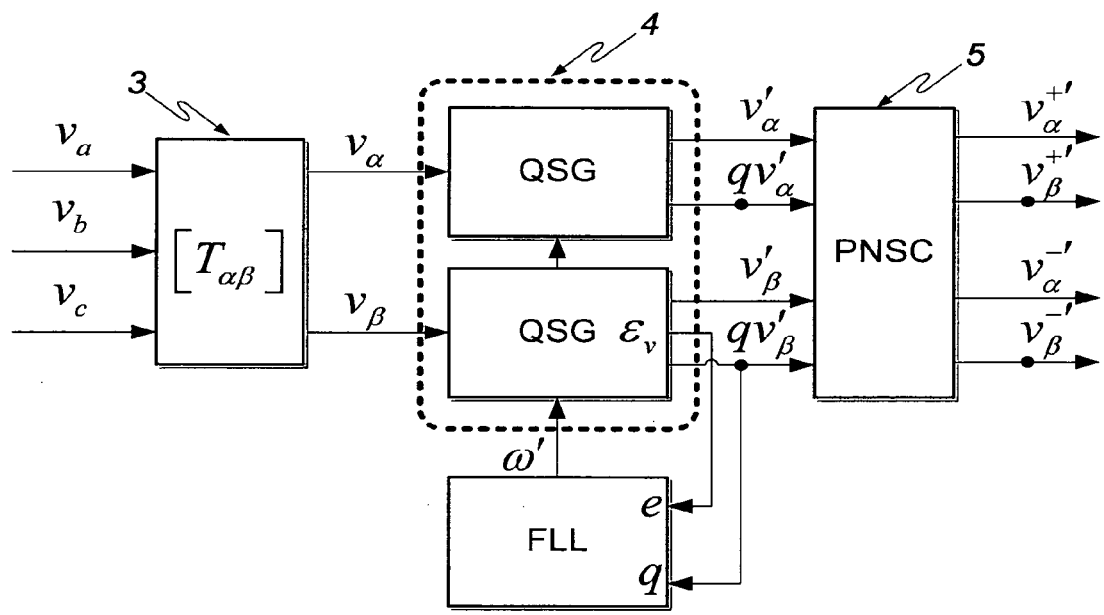
FIG. 2 shows a general block diagram of the three-phase implementation of the RTGMS object of this invention. In this figure, the block marked with {3} is the Clarke transformation ([$T_{\alpha\beta}$]), with {4} is the dual QSG (DQSG), and with {5} is the positive/negative sequence calculator (PNSC).

In this invention, a set of quadrature signals v' and qv' are obtained from the earlier presented SOGI-based QSG. Taking into account that are necessary two quadrature generators, one for α and another for β components, the quadrature generator in the αβ domain will be called from now on as Dual QSG (DQSG). The DQSG is marked with {4} in FIG. 2.

From (7), the amplitude and phase-angle of the positive- and negative sequence components can be calculated from the output of the PNSC as follow:

$$|v^{+'}| = \sqrt{(v_\alpha^{+'})^2 + (v_\beta^{+'})^2}\ ;\ \cos\theta^{+'} = \frac{v_\alpha^{+'}}{|v^{+'}|};\ \sin\theta^{+'} = \frac{v_\beta^{+'}}{|v^{+'}|}, \quad (8a)$$

$$|v^{-'}| = \sqrt{(v_\alpha^{-'})^2 + (v_\beta^{-'})^2}\ ;\ \cos\theta^{-'} = \frac{v_\alpha^{-'}}{|v^{-'}|};\ \sin\theta^{-'} = \frac{v_\beta^{-'}}{|v^{-'}|}, \quad (8b)$$

where $|v^{+'}|$ and $|v^{-'}|$ are the voltage amplitudes and $\theta^{+'}$ and $\theta^{-'}$ are the phase angles of the sequence components.

Figure 7:
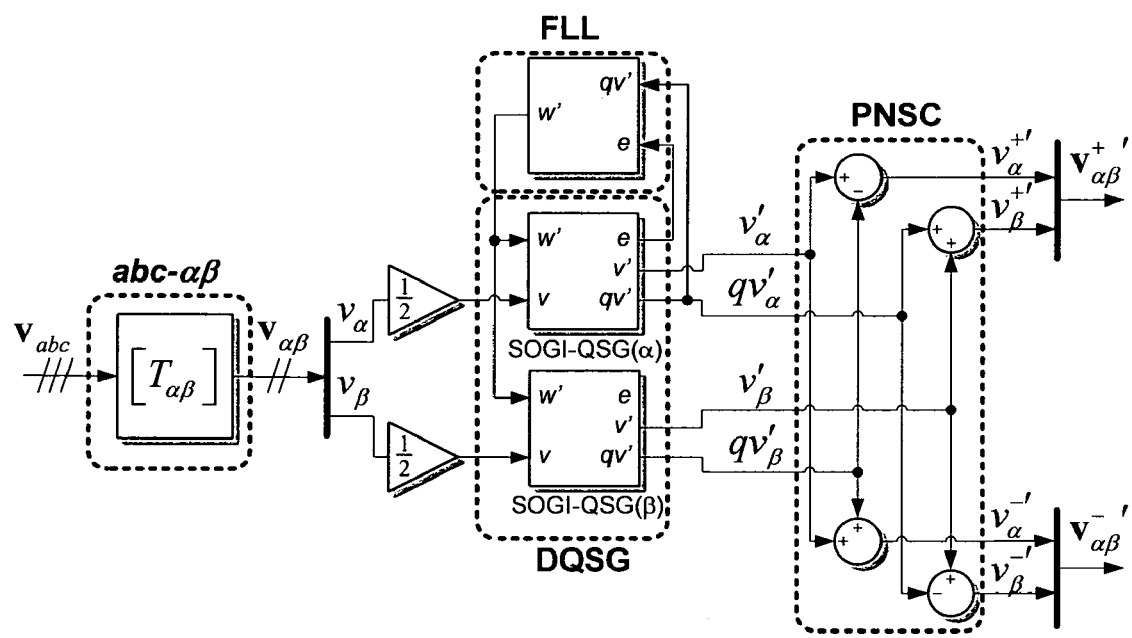
FIG. 7 shows a detailed diagram of preferred embodiment for the RTGMS object of this invention applied to a three-phase system. The three main building blocks, namely the DQSG, the FLL and the PNSC are highlighted in this figure.

Gathering the three main blocks previously presented, the proposed RTGMS for three-phase applications is sown in FIG. 7. In relation to previous approaches for real-time monitoring of three-phase systems, the system presented in this invention is extremely robust and simple, and overcomes all the drawbacks of earlier solutions; achieving proper positive- and negative-sequence components identification even under severe faulty grid operating conditions.

When $v_{\alpha\beta}$ is a positive-sequence balanced sinusoidal voltage at frequency ω, its α-β components keep the following relationship:

$$v_\beta(s) = -\frac{s}{\omega}v_\alpha(s) \quad (9)$$

Therefore, from (4) and (7) can be written that:

$$v_\alpha^{+'}(s) = \frac{1}{2}(v_\alpha'(s) - qv_\beta'(s)) = \frac{1}{2}\left(D(s) + \frac{s}{\omega}Q(s)\right)v_\alpha(s) \quad (10)$$

Figure 8:
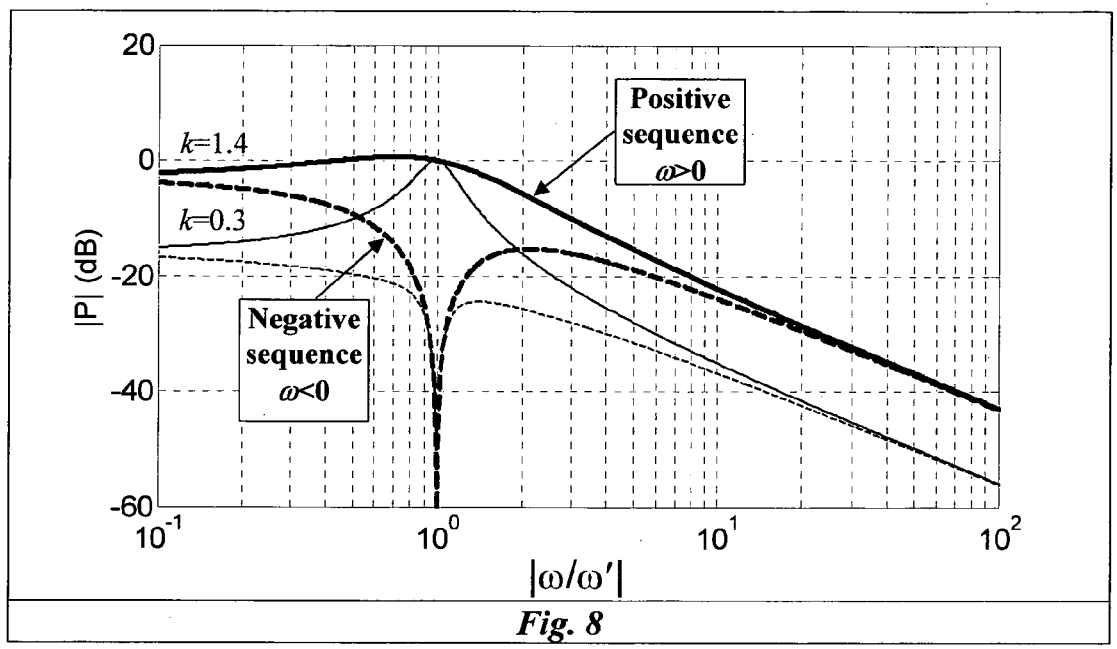
FIG. 8 shows the frequency response of three-phase monitoring system in the detection of the positive sequence component, i.e., the Bode diagram from $v_\alpha$ to $v_\alpha^{+'}$ with $\omega'$=constant.

Therefore, the transfer function from $v_\alpha$ to $v_\alpha^{+'}$ in the complex frequency domain is given by:

$$P(j\omega) = \frac{v_\alpha^{+'}}{v_\alpha}(j\omega) = \frac{1}{2}\frac{k\omega'(\omega+\omega')}{k\omega'\omega + j(\omega^2 - \omega'^2)} \quad (11)$$

where $\omega'$, the frequency detected by the FLL, is supposed to be in steady-state. Conducting a similar reasoning on the $\beta$ signal, it can be concluded that $v_\beta^{+'}$ has equal amplitude than $v_\alpha^{+'}$ but is 90°-lagging it. To know how $v_{\alpha\beta}^{+'}$ will be when $v_{\alpha\beta}$ is a negative-sequence vector it is only necessary to substitute $\omega$ by $-\omega$ in (11). FIG. 8 plots the amplitude of the transfer function of (11) for positive-sequence ($\omega>0$-continuous line) and negative-sequence ($\omega<0$-dashed line) voltages at the input of the DSOGI-FLL. FIG. 8 reveals that, in steady-state and regarding positive-sequence detection, the DSOGI-FLL acts as both a low-pass filter for positive-sequence and a notch filter for the negative-sequence. FIG. 8 also shows that the smaller value for the gain k the more selective response of the system, which is interesting for harmonics rejection. However, this high selectivity entails higher oscillations in the response and longer stabilization time. Consequently, a trade-off between frequency selectivity and response speed should be adopted. Conclusions obtained for the detection of $v_{\alpha\beta}^{+'}$ are directly applicable to the detection of $v_{\alpha\beta}^{-'}$, being only necessary to swap the roll of the positive- and negative-sequence components.

Experimental Test.

The three-phase implementation of the real-time grid monitoring system object of this invention has been evaluated in an experimental set-up. The sampling frequency of the digital controller were the DSOGI-PLL algorithm was implemented was set to 15 kHz. In the following results from such experiments are shown.

Figure 9:
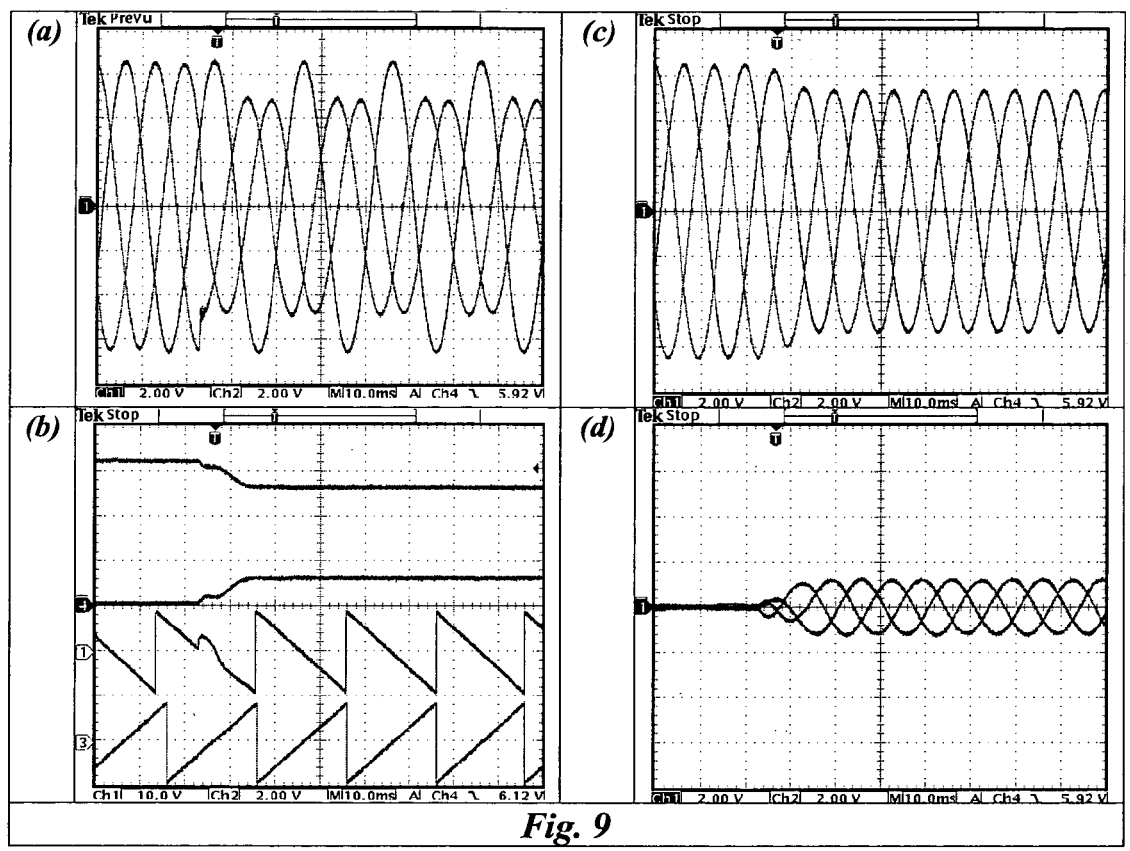
FIG. 9 shows some experimental results regarding the response of the three-phase real-time grid monitoring system (DSOGI-FLL) in presence of a voltage sag type C. (a) faulty grid voltage; (b) amplitudes and phase-angles detected; (c) detected positive-sequence signals; (d) detected negative-sequence signals

In a first experiment the ac-power source suddenly decreases the rms voltage of one phase from 1 pu to 0.45 pu. This fault is propagated through Δγ transformer as a dip type C, being $\vec{V}^+=0.818|0°$ pu and $\vec{V}^-=0.182|0°$ pu the positive- and negative-sequence phasors during the fault. FIG. 9 shows the waveforms from this first experiment, where it is remarkable the high speed in the detection, achieving precise results in less than one grid cycle. It is worth to notice that the detected phase-angles for both the positive- and negative-sequence voltages show a coherent evolution before the grid fault happens. It is because of the nonidealities of the experimental plant, which are giving rise to a very faint but steady imbalance in the grid voltage. The high sensibility of the DSOGI-FLL allows detecting this tiny negative-sequence component before the grid fault occurrence.

Figure 10:
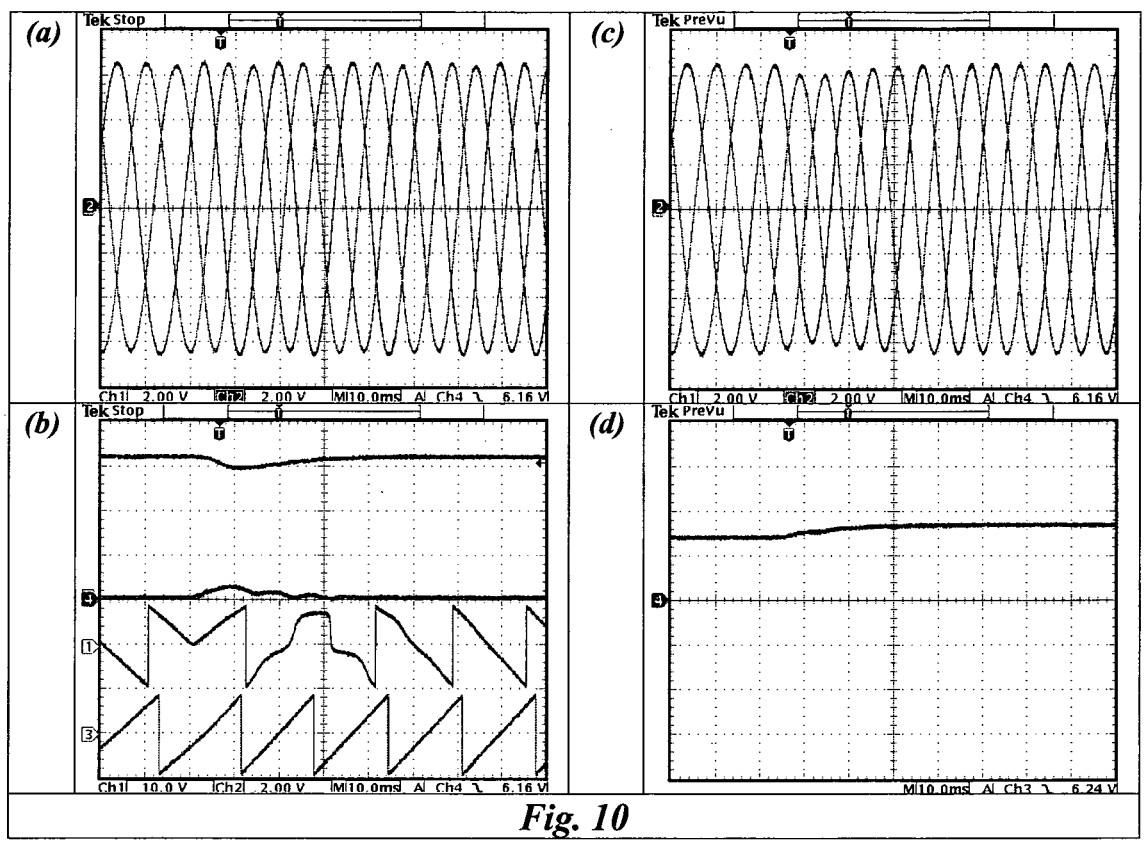
FIG. 10 shows some experimental results regarding the response of the three-phase real-time grid monitoring system (DSOGI-FLL) in presence of frequency variation (from 50 Hz to 60 Hz). (a) faulty grid voltage; (b) amplitudes and phase-angles detected; (c) detected positive-sequence signals; (d) detected frequency.

In a second experiment the grid frequency varies from 50 Hz to 60 Hz. Waveforms of FIG. 10 validate the frequency-adaptive characteristic of the DSOGI-FLL which is able to overcome this big jump of frequency without oscillations in about 40 ms.

Figure 11:
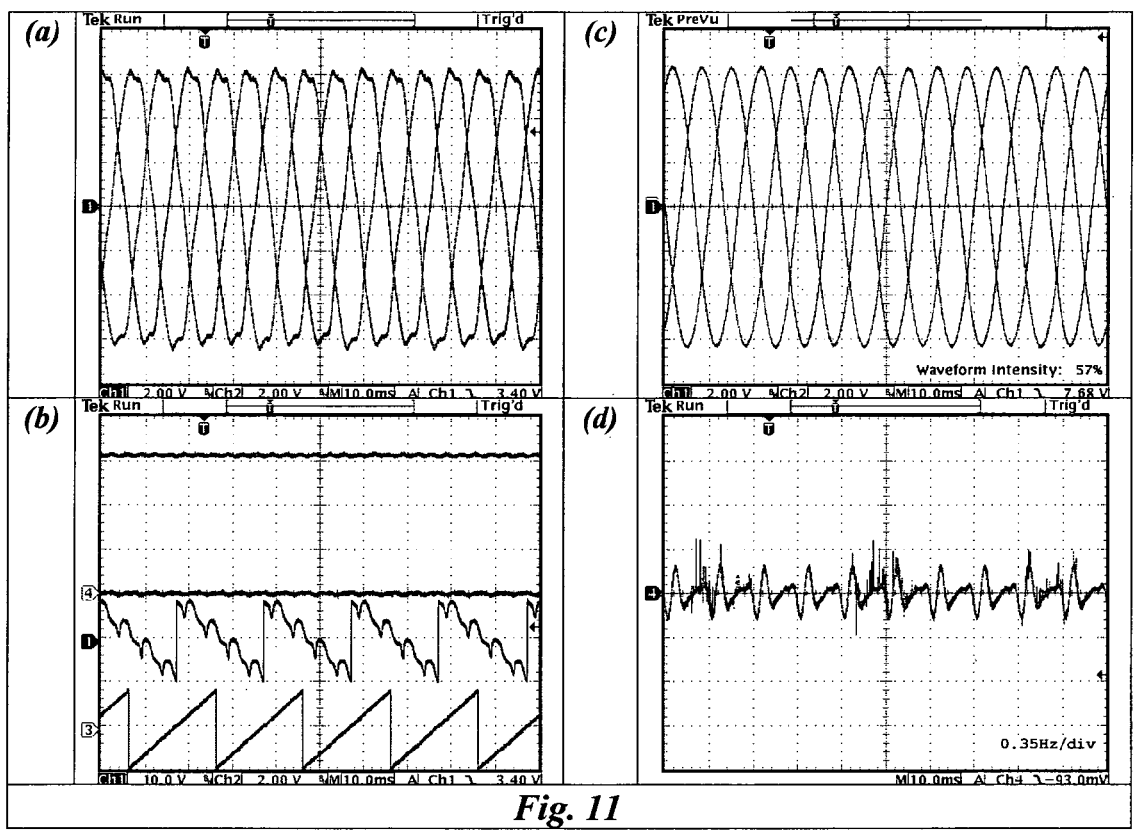
FIG. 11 shows some experimental results regarding the response of the three-phase real-time grid monitoring system (DSOGI-FLL) in presence of harmonics (THD=5%. (a) faulty grid voltage; (b) amplitudes and phase-angles detected; (c) detected positive-sequence signals; (d) ripple in the detected frequency (magnified)

A third experiment is devoted to evaluate the immunity of the DSOGI-FLL to distortion in the grid voltage. The grid voltage waveform was distorted with a THD of 5%. According to the waveforms shown in FIG. 11, it is notable the high quality of the positive-sequence detected voltage. Since the insignificant amplitude of the negative-sequence component, there exists high distortion in the phase-angle calculated by (7b) for this component. As fast as the negative-sequence component amplitude rises to higher levels, distortion in its phase-angle calculation decreases.

Conventional grid monitoring techniques come from the evolution of the well known single-phase PLL technique and hence all of these conventional monitoring algorithms are based on the detection of the phase-angle of the voltage or current to be monitored. The usage of synchronous reference frames and trigonometric functions is a common characteristic in the implementation of phase detectors and voltage controlled oscillators in such conventional grid monitoring techniques.

This invention presents a new monitoring system which is not based on the detection of the phase-angle but based on the detection of the grid frequency. Therefore, the phase detector and the voltage controlled oscillator of the conventional systems are not necessary anymore under the proposed grid monitoring approach. A frequency adaptive filter based on second-order generalized integrators constitutes the core in the monitoring system object of this invention.

REFERENCES

[1] V. Laura and V. Blasco, "Operation of a phase locked loop system under distorted utility conditions," *IEEE Trans. Ind. Applicat.*, vol. 33, January/February 1997, pp. 58-63.
[2] S. Chung, "A phase tracking system for three phase utility interface inverters," *IEEE Trans. Power Electron.*, vol. 15, pp. 431-438, May 2000.
[3] P. Rodriguez, J. Pou, J. Bergas, J. I. Candela, R. P. Burgos, and D. Boroyevich, "Decoupled double synchronous reference frame PLL for power converters control," *IEEE Trans. on Power Electron.*, vol. 22, pp. 584-592, March 2007.
[4] M. Karimi-Ghartemani and M. R. Iravani, "A method for synchronization of power electronic converters in polluted and variable-frequency environments," *IEEE Trans. Power Systems*, vol. 19, pp. 1263-1270, August 2004.
[5] Patent WO/2002/091578, "Phase Locked-loop System," inventor Masoud Karimi-Ghartemani, published Nov. 14, 2002.
[6] US patent US 2005/0231871 A1, "Three-phase power signal processor," inventor Masoud Karimi-Ghartemani, published Oct. 20, 2005.
[7] P. Rodriguez, R. Teodorescu, I. Candela, A. V. Timbus, M. Liserre, and F. Blaab-jerg, "New positive-sequence voltage detector for grid synchronization of power converters under faulty grid conditions," in Proc. IEEE Power Electron. Specialists Conf., PESC '06, 2006, pp. 1-7.
[8] S. M. Silva, B. M. Lopes, B. J. Cardoso, R. P. Campana, and W. C. Boaventura, "Performance evaluation of PLL algorithms for single-phase grid-connected systems," in *Proc. IEEE Ind. Applicat. Conf.*, vol. 4, 2004, pp. 2259-2263.
[9] A. Ghosh and A. Joshi, "A new algorithm for the generation of reference voltages of a DVR using the method of instantaneous symmetrical components," *IEEE Power Eng. Review*, vol. 22, pp. 63-65, January 2002.
[10] W. V. Lyon, *Application of the Method of Symmetrical Components*, New York: McGraw-Hill, 1937.

The invention claimed is:

1. A real-time grid monitoring systems for multi-phase applications comprising:
   a multi-phase (abc) to two-phase (αβ) transformation processor responsive to the multi-phase input voltage or current for generating a set of two signals collecting information about the positive and negative-sequence components of the original multi-phase input, wherein the real-time grid monitoring systems further comprises:

a dual quadrature signal generator (DQSG), comprising two quadrature signal generators (QSGs) responsive to the αβ input signals for obtaining both the in-phase and the in-quadrature versions of the αβ monitored signals;

a frequency adaptive loop, comprising a frequency-locked loop (FLL) responsive to frequency variations in the αβ monitored signals for modifying a tuning frequency of both QSGs in order to make the tuning frequency equal to a fundamental frequency of the αβ monitored signals;

a real-time positive-negative-sequence calculator (PNSC) based on an αβ reference frame that is responsive to the in-quadrature signals, wherein said in-quadrature signals are supplied by the DQSG for splitting up the in-quadrature signals into positive and negative-sequence components of the αβ reference frame.

2. The real-time grid monitoring system according to claim 1, wherein the QSGs comprise:
a subtractor comprising:
a first positive input port, to which the αβ monitored signal is coupled;
a second input port to which the filtered in-phase output signal of the QSG is coupled; where
at least one output port providing a error signal, wherein the output port of the subtractor is coupled to the input port of a QSG gain block and to an input port of the FLL block, and wherein the QSG gain block regulates the damping factor of the QSG, and provides an amplified error signal at its output;
a second order generalized integrator (SOGI) comprising:
at least a first input port coupled to the output port of the QSG gain block and receiving the amplified error signal from the QSG gain block;
a second input port coupled to an output of the FLL and receiving an input signal therefrom;
a first output port providing a filtered in-phase version of the input signal from the FLL; and
a second output port providing a filtered in-quadrature component of the input signal from the FLL, wherein the in-phase output signal forms the feedback signal coupled to the negative input port of the QSG subtractor, and wherein the filtered in-quadrature output signal is coupled to one of the inputs ports of the FLL.

3. The real-time grid monitoring system according to claim 2, wherein the SOGI further comprises a specific open loop chain implementation for improving circuit stability in response to sudden changes in the input signal, and wherein the SOGI has the following functional block topology: multiplier-integrator-integrator-multiplier.

4. The real-time grid monitoring system according to claim 1 wherein the FLL comprises:
a multiplier comprising:
at least one input port to which the error signal from the subtractor of the QSG is coupled, and
a second input port, to which a negative version of the filtered in-quadrature output signal of the QSG is coupled, and at least one output port providing an error signal, wherein the output port of the multiplier is coupled to an input port of an FLL gain regulator;
an FLL gain block, that regulates the dynamics of the FLL, comprising:
at least one input port, to which the error output signal from the multiplier is coupled, providing an amplified error signal at its output;
a linear integrator block comprising:
at least one input port, to which amplified error signal from the FLL gain block is coupled, and
at least one output port providing an estimated frequency variation in the input signal, wherein a frequency variation signal at the linear integrator block output port is added to a preset feed-forward frequency in order to provide at the output port of the FLL the tuning frequency for the QSG.

5. The real-time grid monitoring system according to claim 1, wherein a first input port of the DQSG is coupled to the α signal and a second input port to the β signal, wherein the signals at both input ports of the DQSG are provided by the output of the three-phase (abc) to two-phase (αβ) transformation processor; wherein a third input port of the DQSG is coupled to the output of the FLL and provides the tuning frequency for both QSGs in the DQSG.

6. The real-time grid monitoring system according to claim 1, wherein only one phase input signal (a, b, or c) is provided to the input of a single QSG, which is tuned by a FLL that is synchronized with the monitored phase-signal, for real-time grid monitoring of single-phase systems.

7. A method for real-time grid monitoring for multi-phase applications, the method comprising:
transforming a multi-phase (abc) signal to a two-phase (αβ) signal, wherein the transformation process is responsive to the multi-phase input voltage or current;
collecting information about the positive and negative-sequence components of the original multi-phase input;
generating a dual quadrature signal using a dual quadrature signal generator (DQSG) comprising two quadrature signals generated by two quadrature signal generators (QSG) wherein said quadrature signals are responsive to αβ input signals for obtaining both the in-phase and the in-quadrature versions of αβ monitored signals;
using a frequency adaptive loop, wherein the frequency adaptive loop is a frequency-locked loop (FLL) that is responsive to frequency variations in the monitored signals for
modifying the tuning frequency of a both the QSGs in order to make the tuning frequency equal to a fundamental frequency of αβ monitored signals;
calculating a real-time positive-negative-sequence (PNSC) based on an αβ reference frame that is responsive to an in-quadrature signal supplied by the DSQG, for splitting up the in-quadrature signal into positive and negative-sequence components of αβ reference frame.

* * * * *